United States Patent
Yang

(10) Patent No.: US 8,248,841 B2
(45) Date of Patent: Aug. 21, 2012

(54) BOOSTED GATE VOLTAGE PROGRAMMING FOR SPIN-TORQUE MRAM ARRAY

(75) Inventor: Hsu Kai Yang, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/806,094

(22) Filed: Aug. 5, 2010

(65) Prior Publication Data
US 2010/0321985 A1    Dec. 23, 2010

Related U.S. Application Data

(63) Continuation of application No. 12/313,487, filed on Nov. 20, 2008, now Pat. No. 7,782,661.

(51) Int. Cl.
*G11C 11/00* (2006.01)
(52) U.S. Cl. ........................................ 365/158
(58) Field of Classification Search ............ 365/48, 365/158, 171
See application file for complete search history.

(56) References Cited

U.S. PATENT DOCUMENTS

| | | | |
|---|---|---|---|
| 6,424,563 B2 | 7/2002 | Honigschmid | |
| 6,816,405 B1 | 11/2004 | Lu et al. | |
| 6,922,371 B2 * | 7/2005 | Takahashi et al. | 365/227 |
| 7,345,912 B2 | 3/2008 | Luo et al. | |
| 7,345,945 B2 | 3/2008 | Jeon et al. | |
| 2004/0141367 A1* | 7/2004 | Amano et al. | 365/158 |
| 2005/0232001 A1* | 10/2005 | Tsuji | 365/158 |
| 2005/0281080 A1* | 12/2005 | Dray et al. | 365/171 |
| 2007/0097730 A1* | 5/2007 | Chen et al. | 365/158 |
| 2008/0266943 A1 | 10/2008 | Yang et al. | |

OTHER PUBLICATIONS

"A Novel Nonvolatile Memory with Spin Torque Transfer Magnetization Switching: Spin-RAM," by M. Hosomi et al., 205 IEEE International.
Electron Devices Meeting, 2005, IEDM Technical Digest. Dec. 2005, pp. 459-462.

* cited by examiner

*Primary Examiner* — Hoai V Ho
*Assistant Examiner* — Anthan Tran
(74) *Attorney, Agent, or Firm* — Saile Ackerman LLC; Stephen B. Ackerman; Billy Knowles

(57) ABSTRACT

A gate voltage boosting circuit provides a voltage boost to a gate of a select switching MOS transistor of a spin-torque MRAM cell to prevent a programming current reduction through an MTJ device of the spin-torque MRAM cell. A spin-torque MRAM cell array is composed of spin-torque MRAM cells that include a MTJ element and a select switching device. A local word line is associated with one row of the plurality of spin-torque MRAM cells and is connected to a gate terminal of the select switching devices of the row of MRAM cells to control activation and deactivation. One gate voltage boosting circuit is placed between an associated global word line and an associated local word line. The gate voltage boosting circuits boost a voltage of a gate of the selected switching device during writing of a logical "1" to the MTJ element of a selected spin-torque MRAM cell.

34 Claims, 6 Drawing Sheets

BOOSTED GATE VOLTAGE PROGRAMMING FOR SPIN-TORQUE MRAM ARRAY

This is a continuation of U.S. patent application Ser. No. 12/313,487, filed on Nov. 20, 2008, now U.S. Pat. No. 7,782,661 assigned to the same assignee as the present invention, and incorporated herein by reference in its entirety.

RELATED PATENT APPLICATIONS

U.S. patent application Ser. No. 11/789,324 filed on Apr. 24, 2007, assigned to the same assignee as the present invention, and incorporated herein by reference in its entirety.

BACKGROUND OF THE INVENTION

1. Field of the Invention

This invention relates generally to circuits and methods for programming memory array structures. More particularly, this invention relates circuits and methods for boosting a gate voltage of a select switching transistor of spin-torque magnetic random access memory (MRAM) cells for programming spin-torque magnetic random access memory (MRAM) cells in an array.

2. Description of Related Art

The term Spin-RAM or spin-torque MRAM refers to a spin torque transfer magnetization switching (STS) MRAM. In this context, the term "spin" refers to the angular momentum of electrons passing through an MTJ that will alter the magnetic moment of a free layer of an MTJ device. Electrons possess both electric charge and angular momentum (or spin). It is known in the art that a current of spin-polarized electrons can change the magnetic orientation of a free ferromagnetic layer of an MTJ via an exchange of spin angular momentum. The major difference between conventional MRAM and spin-torque MRAM is their programming mechanism. Programming is accomplished by bi-direction currents passing through the Spin-RAM magnetic layers, while conventional MRAM is programmed by fields generated by external current or currents. Reading is similar for both types of the memories, namely detecting the resistance difference of magnetic tunnel junction depending on whether the free layer magnetic polarity is parallel or anti-parallel with the fixed layer. The programming currents required for spin-torque MRAM is much lower than the conventional MRAM and allows a more scalable with geometry reduction.

"A Novel Nonvolatile Memory with Spin Torque Transfer Magnetization Switching: Spin-Ram", Hosomi, et al., IEEE International Electron Devices Meeting, 2005. IEDM Technical Digest. December 2005, pp.: 459-462, provides a nonvolatile memory utilizing spin torque transfer magnetization switching (STS), abbreviated Spin-RAM. The Spin-RAM is programmed by magnetization reversal through an interaction of a spin momentum-torque-transferred current and a magnetic moment of memory layers in magnetic tunnel junctions (MTJs), and therefore an external magnetic field is unnecessary as that for a conventional MRAM.

Refer now to FIG. 1 for a block diagram illustrating a spin-torque MRAM cell and its peripheral circuitry of the prior art. A spin-torque MRAM cell 100 consists of an MTJ element 105 and a select switching Metal Oxide Semiconductor (MOS) transistor 110. The MTJ element 105 is composed of a pinned ferromagnetic layer 102 and a free ferromagnetic layer 104, and a tunnel barrier layer 103. The drain of the MOS transistor 110 is connected through a nonmagnetic layer to the pinned ferromagnetic layer 102. The free ferromagnetic layer 104 is connected to a bit line 115 and the source of the MOS transistor 110 is connected the source select line 120. The bit line 115 and source select line 120 are connected to the bipolar write pulse/read bias generator 125. The bipolar write pulse/read bias generator 125 provides the necessary programming current to the MTJ element 105 through the bit line 115 and the source select line 120. The direction being determined by logic state being programmed to the MTJ element 105.

The gate of the select switching MOS transistor 110 is connected to a word line 130. The word line 130 transfers a word line select voltage to the gate of the select switching MOS transistor 110 to activate the select switching MOS transistor 110 for reading or writing the logic state of the MTJ element 105. A sense amplifier 135 has one input terminal connected to the bit line and a second input terminal connected to a voltage reference circuit 140. When the word line 115 has the word line select voltage activated to turn on the select switching MOS transistor 110, the bipolar write pulse/read bias generator 125 generates a bias current that passes through MTJ element 105. A voltage is developed across the MTJ element 105 that is sensed by the sense amplifier 135 and compared with the reference voltage generator to determine the logic state written to the MTJ element 105. This logic state is transferred to the output terminal of the sense amplifier 135 as to the data output signal 145.

Refer to FIG. 2 for a description of an array of spin-torque MRAM cells 100. The spin-torque MRAM cells 100 are arranged in rows and columns. The gate of the MOS transistor of each of the spin-torque MRAM cell 100 on a row of the spin-torque MRAM cells 100 is connected to a word line 200a, 200b, ..., 200n−1, 200n to receive the word line select signal to activate the MOS transistor for writing and reading of a selected spin-torque MRAM cell 100. One terminal of each of MTJ element of the spin-torque MRAM cells 100 on a column of spin-torque MRAM cells 100 is connected to a bit line 205a, 205b, ..., 205m. The source of each MOS transistor of each of the spin-torque MRAM cells 100 is connected to a source select line 210a, 210b, ..., 210m. During a write operation, a programming voltage is transferred either from a selected bit line 205a, 205b, ..., 205m through the selected spin-torque MRAM cell 100 to the selected source select line 210a, 210b, ..., 210m or from selected source select line 210a, 210b, ..., 210m through the selected spin-torque MRAM cell 100 to the a selected bit line 205a, 205b, 205m, dependent upon the logic state to be written to the selected spin-torque MRAM cell 100.

U.S. Patent Application 2007/0279968 (Luo, et al.) provides a magnetic memory magnetic memory cells attached to local word lines that are in turn connected to global word lines. The magnetic memory further includes bit lines connected to the magnetic elements, and source lines connected to the selection device. Each magnetic memory cell includes a magnetic element and a selection device connected with the magnetic element. The magnetic element is programmed by first and second write currents driven through the magnetic element in first and second directions. The local word lines are connected with the selection device of and have a first resistivity. Each global word line corresponds to a portion of the local word lines and has a resistivity lower than the first resistivity.

U.S. Pat. No. 6,816,405 (Lu, et al.) describes a segmented word line architecture for cross point magnetic RAM. The MRAM includes a plurality of magnetic memory cells, a plurality of local word lines. Each of the local word lines being operatively coupled to at least one memory cell for assisting in writing a logical state of the at least one memory cell. Each of the local word lines are connected to a global word lines. The global word lines are isolated from the memory cells and are coupled by write circuits to the global word lines. Bit lines are operatively coupled to the memory cells for selectively writing a logical state of one or more of the memory cells. Each of the write circuits is configurable as a current source and/or a current sink for supplying and/or returning, respectively, at least a portion of a write current for assisting in writing one or more memory cells. The write circuits are configured to selectively distribute the write current across the global word lines so that stray magnetic field interaction between selected memory cells and half-selected and/or unselected memory cells is reduced.

U.S. Pat. No. 7,345,945 (Jeon, et al.) teaches a line driver circuit for a semiconductor memory device. The semiconductor memory device has a word line driver circuit configured in stages. A plurality of sub word line driver circuits are connected, in parallel, to each main word line, and provide a sub word line enable signal to a selected sub word line in response to a main word line enable signal provided through a main word line. A plurality of (local) word line driver circuits are connected in parallel, to each sub word line and provide a local word line enable signal to a selected local word line in response to the (main/sub) word line enable signal so as to operate a plurality of memory cells connected to the selected local word line.

U.S. Pat. No. 6,424,563 (Honigschmid) describes an MRAM memory cell that includes a magnetoresistive resistor and a switching transistor. The magnetoresistive resistor is located between a central metallization plane and an upper metallization plane. The central metallization plane serves for the word line stitch and also for writing. A word line boost circuit is provided in the stitch region of each cell, with the result that the critical voltage is not achieved in the magnetoresistive resistor but the switching transistor can be turned on.

SUMMARY OF THE INVENTION

An object of this invention is to provide voltage boost to a gate of a select switching MOS transistor of the spin-torque MRAM cell to prevent a programming current reduction through an MTJ device of a spin-torque MRAM cell.

To accomplish at least this object, various embodiments include a spin-torque MRAM cell array that has a plurality of spin-torque MRAM cells arranged in rows and columns. Each of the spin-torque MRAM cells includes a magnetic tunnel junction element and a select switching device. The select switching device has a drain terminal connected to a first terminal of the magnetic tunnel junction element. The spin-torque MRAM cell array has a plurality of local word lines. Each local word line is associated with one row of the plurality of spin-torque MRAM cells and connected to a gate terminal of the select switching device of each spin-torque MRAM cell on the one row to control activation and deactivation of the select switching device. The spin-torque MRAM cell array has plurality of gate voltage boosting circuits where each gate voltage boosting circuit is placed between an associated global word line of a plurality of global word lines and an associated local word line of the plurality of local word lines. The gate voltage boosting circuits boost a to local word line voltage applied to a gate of the selected switching device during writing of a first level (a logical "1") to the magnetic tunnel junction element of a selected spin-torque MRAM cell when activated by a local word line control signal.

Each of the plurality of gate voltage boosting circuits incorporates a high voltage switching transistor having a drain terminal connected to the global word line associated with the gate voltage boosting circuit. A source of the high voltage switching transistor is connected to the gate of the select switching device and a gate of the high voltage switching transistor is connected to receive the local word line control signal to activate and deactivate the high voltage switch transistor for boosting the local word line voltage. In some embodiments, each of the plurality of gate voltage boosting circuits further includes a clamping device to prevent an over boost condition.

The spin-torque MRAM cell array further includes a plurality of bit lines. Each bit line is associated with one column of the columns of the plurality of spin-torque MRAM cells and is connected to a second terminal of the magnetic tunnel junction element. A common source line is connected to a source of each of the select switching devices of the plurality of spin-torque MRAM cells to provide a source or sink for a write current for programming the spin-torque MRAM cell. The common source line is connected to a common source select circuit connected to the common source line for selecting the source or sink for the write current.

The common source line select circuit includes a first transistor having a drain terminal connected to a first voltage source and a source terminal connected to the common source line. A second transistor has a drain terminal connected to the common source line and a source terminal connected to a ground reference point. The common source line control signals are connected to gates of the first and second transistors to turn on and turn off the first and second transistors to provide a source or sink for the write current through the selected spin-torque MRAM cell during a program operation.

The spin-torque MRAM cell array includes a plurality of bit line precharge circuits. Each bit line precharge circuit is associated with one column of the plurality of spin-torque MRAM cells and has a third transistor having a drain terminal connected to a first voltage source and a source terminal connected to an associated bit line. A fourth transistor incorporated in the bit line precharge circuit has a drain terminal connected to the associated bit line and a source terminal connected to a ground reference point. The bit line control signals are connected to gates of the third and fourth transistors to turn on and turn off the third and fourth transistors to control directionality of the write current flow through a selected spin-torque MRAM cell during a program operation.

In various embodiments of the spin-torque MRAM cell array, a selected spin-torque MRAM cell is written to the first level by activating the global word line associated with the selected spin-torque MRAM cell at a first time. The local word line control signal is activated at the first time to effectively connect the global word line associated with the selected spin-torque MRAM cell and the local word line associated with the selected spin-torque MRAM cell. A data input signal is applied as the first level to a bit line associated with the selected spin-torque MRAM cell to generate a current to program the magnetic tunnel junction element of the selected spin-torque MRAM cell to the first level at the first time. At a second time, the local word line control signal is deactivated to effectively disconnect the global word line associated with the selected spin-torque MRAM cell and the local word line associated with the selected spin-torque MRAM cell. The local word line associated with the selected spin-torque MRAM cell is thus boosted to a higher voltage level to compensate for a rise of a voltage at a source of the select switching device of the selected spin-torque MRAM cell.

In other embodiments, a spin-torque magnetic random access memory device incorporates a plurality of spin-torque MRAM cell arrays arranged in a plurality of groups. Each spin-torque MRAM array has a plurality of spin-torque MRAM cells arranged in rows and columns. Each spin-torque MRAM cell includes a magnetic tunnel junction element and a select switching device. The select switching device has a drain terminal connected to a first terminal of the magnetic tunnel junction element. Each spin-torque MRAM cell array has a plurality of local word lines. Each local word line is associated with one row of the plurality of spin-torque MRAM cells and connected to a gate terminal of the select switching device of each spin-torque MRAM cell on the one row to control activation and deactivation of the select switching device.

Each of the spin-torque MRAM cell arrays has a plurality of gate voltage boosting circuits. Each gate voltage boosting circuit is placed between an associated global word line of a plurality of global word lines and an associated local word line of the plurality of local word lines to boost a voltage of a gate of the selected switching device during writing of a first level to the magnetic tunnel junction element of a selected spin-torque MRAM cell when activated by a local word line control signal;

Each of the plurality of gate voltage boosting circuits has a high voltage switching transistor. The high voltage switching transistor has a drain terminal connected to the global word line associated with the gate voltage boosting circuit, a source connected to the associated local word line and thus to the gate of the select switching device of each of the spin-torque MRAM cells and a gate of the high voltage switching transistor is connected to receive the local word line control signal for selecting one of the plurality of spin-torque MRAM cells. In some embodiments of the spin-torque magnetic random access memory device, each of the plurality of gate voltage boosting circuits includes a clamping device to prevent an over boost condition.

Each of the spin-torque MRAM cell arrays further includes a plurality of bit lines. Each bit line is associated with one column of the columns of the plurality of spin-torque MRAM cells and connected to a second terminal of the magnetic tunnel junction element.

In various embodiments of the spin-torque magnetic random access memory device, a common source line is connected to a source of each of the select switching devices of the plurality of spin-torque MRAM cells to provide a source or a sink for a write current for programming a selected spin-torque MRAM cell. The common source line of each of the spin-torque MRAM cell arrays is connected to a common source select circuit for selecting the source or sink for the write current. The common source line select circuit has a first transistor having a drain terminal connected to a first voltage source and a source terminal connected to the common source line. A second transistor has a drain terminal connected to the common source line and a source terminal connected to a ground reference point. Common source line control signals are connected to gates of the first and second transistors to turn on and turn off the first and second transistors to provide a source or sink for the write current through the selected spin-torque MRAM cell during a program operation.

In some embodiments of the spin-torque magnetic random access memory device, the spin-torque MRAM cell array further includes a plurality of bit line precharge circuits. Each bit line precharge circuit is associated with one column of the plurality of spin-torque MRAM cells. Each of the plurality of bit line precharge circuits has a third transistor. The third transistor has a drain terminal connected to a first voltage source and a source terminal connected to an associated bit line. A fourth transistor has a drain terminal connected to the associated bit line and a source terminal connected to a ground reference point. The bit line control signals are connected to gates of the third and fourth transistors to turn on and turn off the third and fourth transistors to control directionality of the write current flow through a selected spin-torque MRAM cell during a program operation.

In various embodiments of the spin-torque magnetic random access memory device, a selected spin-torque MRAM cell is written to the first level by activating the global word line associated with the selected spin-torque MRAM cell at a first time. At the first time the local word line control signal is activated to effectively connect the global word line associated with the selected spin-torque MRAM cell and the local word line associated with the selected spin-torque MRAM cell at the first time. A data input signal as the first level (a logical "1") is applied to a bit line associated with the selected spin-torque MRAM cell to generate a current to program the magnetic tunnel junction element of the selected spin-torque MRAM cell to the first level at the first time. At a second time, the local word line control signal is deactivated to effectively disconnect the global word line associated with the selected spin-torque MRAM cell and the local word line associated with the selected spin-torque MRAM cell to boost the local word line associated with the selected spin-torque MRAM cell to a higher voltage level to compensate for a rise of a voltage at a source of the select switching device of the selected spin-torque MRAM cell;

A method for writing a selected spin-torque MRAM cell in the embodiments of an array of spin-torque MRAM cells to a first level begins by providing a plurality of spin-torque MRAM cells arranged in rows and columns. Each spin-torque MRAM cell has a magnetic tunnel junction element and a select switching device. The select switching device has a drain terminal connected to a first terminal of the magnetic tunnel junction element. A plurality of local word lines is provided. Each local word line is associated with one row of the plurality of spin-torque MRAM cells and connected to a gate terminal of the select switching device of each spin-torque MRAM cell on the one row to control activation and deactivation of the select switching device. A plurality of gate voltage boosting circuits is provided such that each gate voltage boosting circuit is placed between an associated global word line of a plurality of global word lines and an associated local word line of the plurality of local word lines for boosting a voltage of a gate of the selected switching device during writing of a first level to the magnetic tunnel junction element of a selected spin-torque MRAM cell when activated by a local word line control signal.

To write the selected spin-torque MRAM cell, the global word line associated with the selected spin-torque MRAM cell is activated at a first time. Also at the first time, the local word line control signal is activated to effectively connect the global word line associated with the selected spin-torque MRAM cell and the local word line associated with the selected spin-torque MRAM cell at the first time. A data input signal as the first is level is applied to a bit line associated with the selected spin-torque MRAM cell to generate a current to program the magnetic tunnel junction element of the selected spin-torque MRAM cell to the first level at the first time. To boost the local word line associated with the selected spin-torque MRAM cell to a higher voltage level to compensate for a rise of a voltage at a source of the select switching device of the selected spin-torque MRAM cell, the local word line control signal is deactivated to effectively disconnect the global word line associated with the selected spin-torque MRAM cell and the local word line associated with the selected spin-torque MRAM cell at a second time.

In various embodiments, a method for forming a spin-torque MRAM cell array includes the step of forming a plurality of spin-torque MRAM cells arranged in rows and columns. The forming of each spin-torque MRAM cell involves the forming a magnetic tunnel junction element and forming a select switching device. The select switching device is formed having a drain terminal connected to a first terminal of the magnetic tunnel junction element. A plurality of local word lines are formed by associating each local word line with one row of the plurality of spin-torque MRAM cells and connecting each word line to a gate terminal of the select switching device of each spin-torque MRAM cell on its associated row to control activation and deactivation of the select switching device. A plurality of gate voltage boosting circuits is formed such that forming each gate voltage boosting circuit includes placing each gate voltage boosting circuit between an associated global word line of a plurality of global word lines and an associated local word line of the plurality of local word lines. Each of the gate voltage boosting circuits boosts a voltage of a gate of the selected switching device during writing of a first level to the magnetic tunnel junction element of a selected spin-torque MRAM cell when activated by a local word line control signal.

Forming each of the plurality of gate voltage boosting circuits includes forming a high voltage switching transistor and connecting a drain terminal to the global word line associated with the gate voltage boosting circuit. A source terminal is connected to the gate of the select switching device. A gate is connected to receive the local word line control signal for selecting one of the plurality of spin-torque MRAM cells. In some embodiments, forming each of the plurality of gate voltage boosting circuits further includes forming a clamping device to prevent an over boost condition.

The method for forming a spin-torque MRAM cell array further forming a plurality of bit lines. Forming each bit line is accomplished by associating each bit line with one column of the columns of the plurality of spin-torque MRAM cells and connecting to a second terminal of the magnetic tunnel junction element.

The method for forming a spin-torque MRAM cell array further includes forming a common source line and connecting the common source line to a source of each of the select switching devices of the plurality of spin-torque MRAM cells to provide a source or sink for a write current for programming the spin-torque MRAM cell. A common source select circuit is formed and connected to the common source line for selecting the source or sink for the write current. The common source line select circuit is formed by forming a first transistor having a drain terminal connected to a first voltage source and a source terminal connected to the common source line. A second transistor is formed with a drain terminal connected to the common source line and a source terminal connected to a ground reference point. Common source line control signals are connected to the gates of the first and second transistors to turn on and turn off the first and second transistors to provide a source or sink for the write current through the selected spin-torque MRAM cell during a program operation.

A plurality of bit line precharge circuits is formed with each bit line precharge circuit connected with one column of the plurality of spin-torque MRAM cells. Each of the plurality of bit line precharge circuits is formed by forming a third and a fourth transistor. The third transistor has a drain terminal connected to a first voltage source and a source terminal connected to an associated bit line. The fourth transistor has a drain terminal connected to the associated bit line and a source terminal connected to a ground reference point. The bit line control signals are connected to gates of the third and fourth transistors to turn on and turn off the third and fourth transistors to control directionality of the write current flow through a selected spin-torque MRAM cell during a program operation.

DETAILED DESCRIPTION OF THE INVENTION

Figure 1:
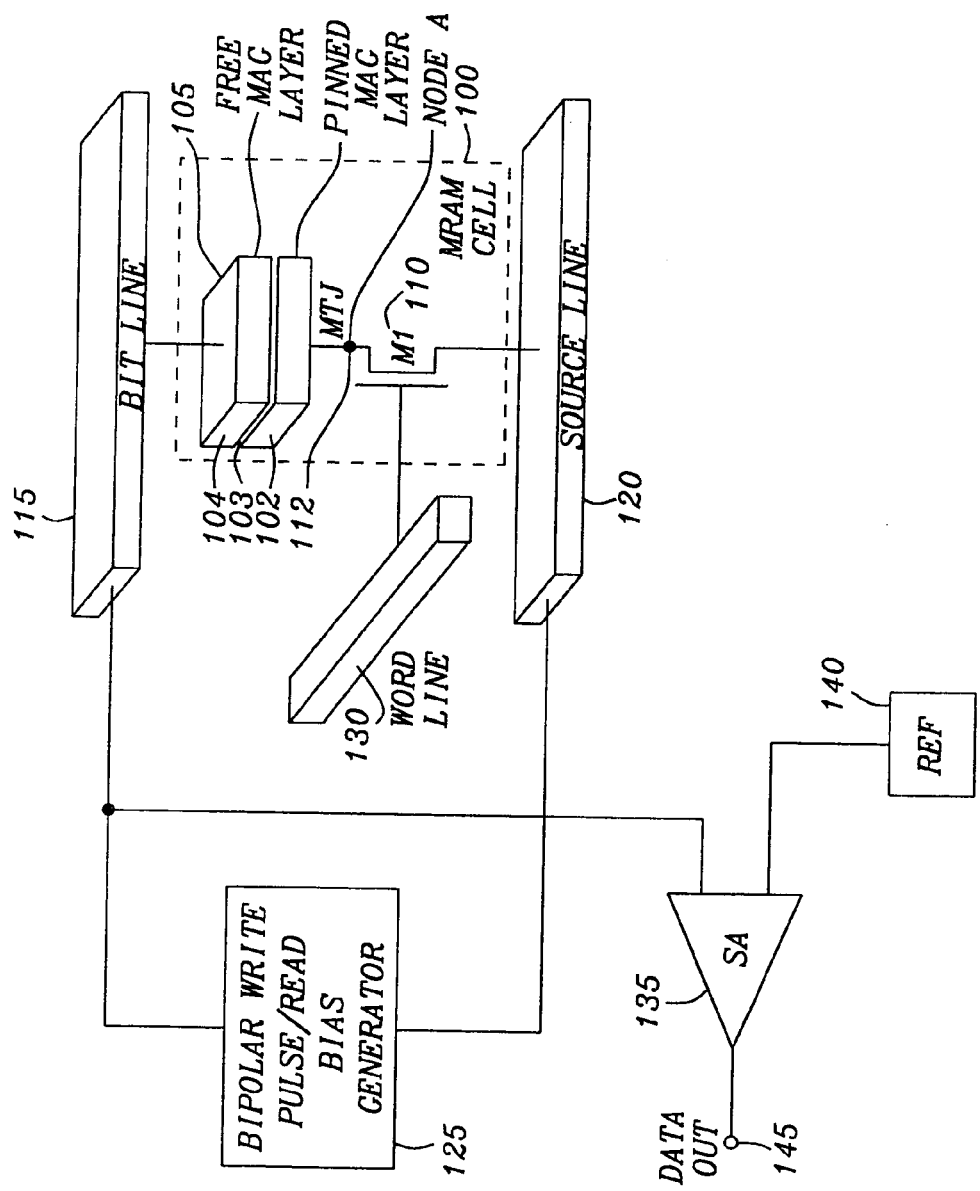
FIG. 1 is a block diagram of a spin-torque magnetic tunnel junction memory cell and its peripheral circuitry of the prior art.
Figure 2:
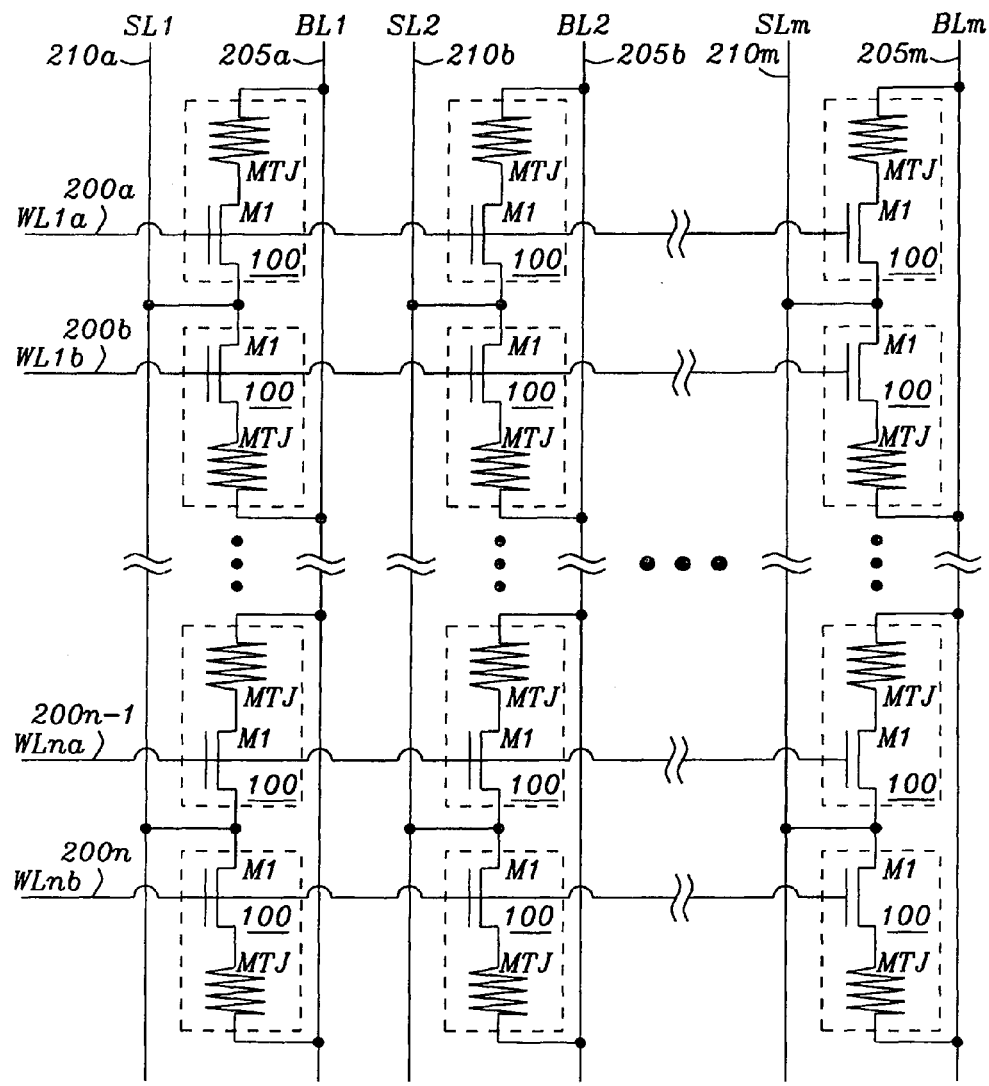
FIG. 2 is schematic diagram of a spin-torque magnetic tunnel junction memory cell array of the prior art.

Referring to FIG. 1, it is known that the gate drive of the select switching MOS transistor 110 of the spin-torque MRAM cell 100 and therefore the current drive capability, of the select switching MOS transistor 110 depends on the voltage between the gate and source (the lower voltage side in case of an NMOSFET) of the select switching MOS transistor 110. When the programming current is in the direction from transistor to MTJ 105, the voltage drop on the MTJ 105 caused the source (Node A) 112 of the select switching MOS transistor 110 to rise. With reasonable programming current and MTJ resistance values used for present state of technology, this voltage rise can be around 0.3V. This voltage rise could cause more than 30% programming current reduction in 1.2 v supply voltage operating environment.

An additional effect due to the threshold voltage of the select switching MOS transistor 110 also increased slightly due to a physical phenomenon called body-effect that additionally reduces the voltage at the source 112 of the select switching MOS transistor 110. The programming current capability of the spin-torque MRAM cell 100 is not symmetric in two directions. Therefore, what is needed is a gate voltage boosting circuit to boost the voltage present on the word line 130 that provides the gate drive voltage of select switching MOS transistor 110 of the spin-torque MRAM cell 100 to compensate for the rise of source voltage at the junction (Node A) 112 of the MTJ 105 and the select switching MOS transistor 110.

Figure 3:
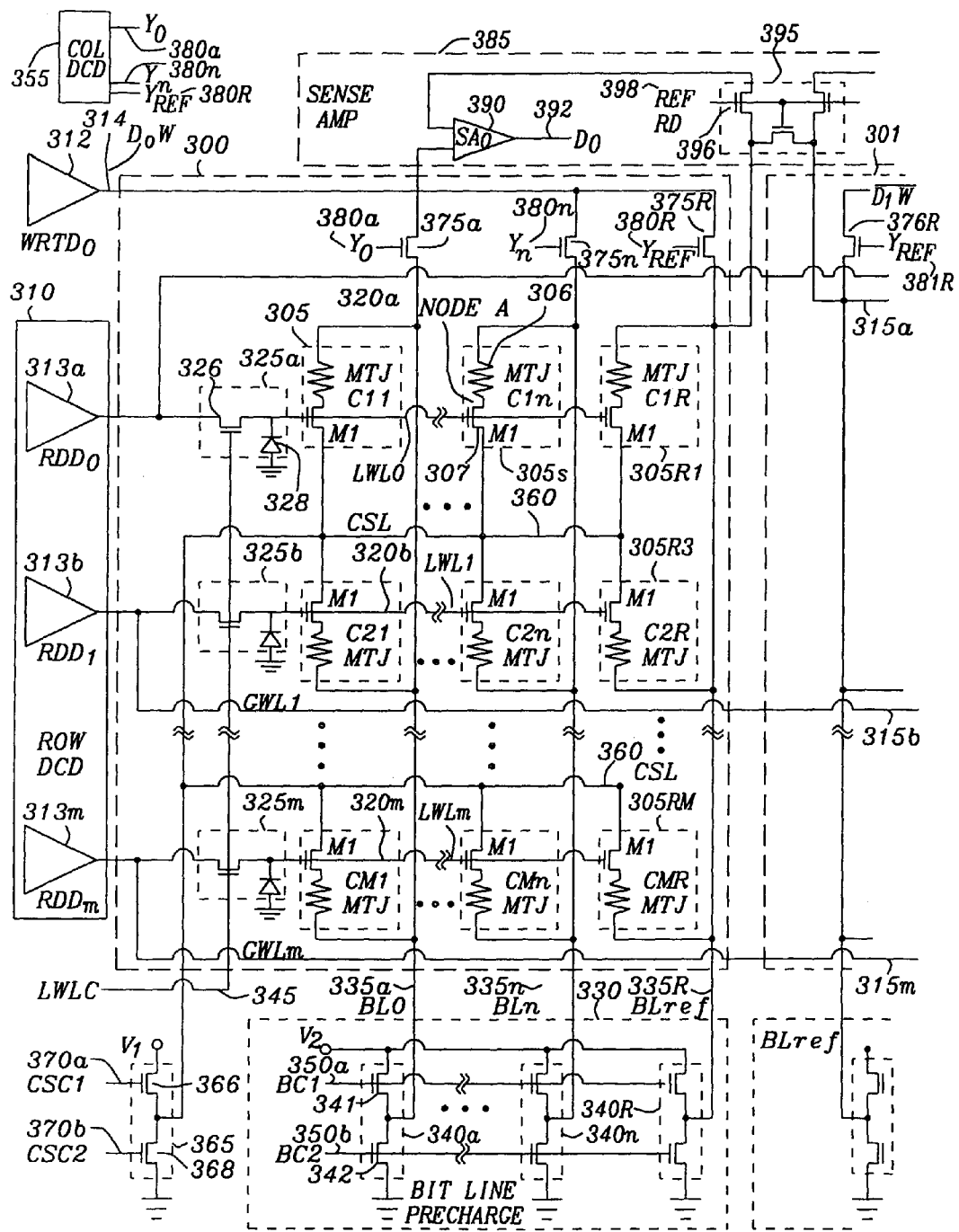
FIG. 3 is schematic diagram of an embodiment of a spin-torque magnetic tunnel junction memory cell array of this invention.

FIG. 3 is schematic diagram of an embodiment of a spin-torque magnetic tunnel junction memory cell array 300 of this invention. The MRAM cells 305 are arranged in rows and columns. The gate of the select switching MOS transistor 307 of each of the MRAM cells 305 on a row of the MRAM cells 305 is connected to a local word line 320a, 320b, . . . , 320m to receive a word line select signal from an associated global word line 315a, 315b, . . . , 315m to activate the MOS transistor for writing and reading of a selected MRAM cell 305. Each of the global word lines 315a, 315b, . . . , 315m are respectively connected to the row decode drivers 313a, 313b, . . . , 313m located within the row decode circuit 310. The row decode drivers 313a, 313b, . . . , 313m transfer the word line select signal to the selected global word line 315a, 315b, ..., 315m as a result of a decode of an address signal that designates the location of the selected MRAM cell 305s.

The spin-torque MRAM cell array 300 is shown with a single block or sub-array of MRAM cells 305 and is associated with one bit of the Data $D_0$ (write data $D_{OW}$ 314 and read data $D_{OR}$ 392). The data driver 312 is connected to receive the write data $D_{OW}$ and transfer it to the bit lines 335a, ..., 335n through the gating MOS transistor 375a, ..., 375n. The global word lines 315a, 315b, ..., 315m pass through the sub-array, as shown, to other sub-arrays of MRAM cells 305.

One terminal of each MTJ element 306 of the MRAM cells 305 on a column of MRAM cells 305 is connected to a bit line 335a, ..., 335n. The source of each MOS transistor 307 of each of the MRAM cells 305 present on a row is connected to a common source line 360. During a write, a programming current is transferred either from a selected bit line 335a, ..., 335n through the selected MRAM cell 305 to the common source line 360 or from common source line 360 through the selected MRAM cell 305 to the a selected bit line 335a, ..., 335n, dependent upon the logic state to be written to the selected MRAM cell 305s.

The common source line 360 is connected to the common source line select circuit 365. The common source line select circuit 365 includes the MOS transistors 366 and 368. The source of the MOS transistor 366 and the drain of the MOS transistor 368 are connected together and to the common source line 360. The drain of the MOS transistor 366 is connected to the voltage source $V_1$ and the source of the MOS transistor 368 is connected to the ground reference point. The common source control signals 370a and 370b are connected to the gates of the MOS transistors 366 and 368 to selectively activate and deactivate the MOS transistors 366 and 368 to connect the common source line 360 to either the voltage source $V_1$ or the ground reference point, dependent on the logical level of the data being written to the selected MRAM cell 305. In the present embodiment, connecting voltage source $V_1$ provides the voltage for writing a level representing a logical "1" and the ground reference point at the common source line 360 in conjunction with the write data $D_{OW}$ 314 provide the voltage for writing a level representing a logical "0".

Each of the bit lines 335a, ..., 335n and the reference bit line 335R is connected to the bit line precharge circuit 330. The bit line precharge circuit 330 includes the bit line precharge circuits 340a, ..., 340n, and 340R that are connected respectively to the bit lines 335a, ..., 335n and 335R. The bit line precharge circuits 340a, 340b, ..., 340n, and 340R each include the MOS transistors 341 and 342. The source of the MOS transistor 341 and the drain of the MOS transistor 342 are connected together and to their associated bit lines 335a, ..., 335n. The drain of the MOS transistor 341 is connected to the voltage source $V_2$ and the source of the MOS transistor 342 is connected to the ground reference point. The bit line control signals 350a and 350b are connected to the gates of all of the bit line precharge circuits 340a, ..., 340n, and 340R to selectively activate and deactivate the MOS transistors 341 and 342 to connect the bit lines to either the voltage source $V_2$ or the ground reference point, dependent on the logical level of the data being written to the selected MRAM cell 305.

One end of each of the bit lines 335a, ..., 335n is connected to the source of a gating MOS transistor 375a, ..., 375n. The drain of each of the gating MOS transistors 375a, ..., 375n is connected to receive one bit of a data input signal $D_{OW}$ 314 and the gate of each of the gating MOS transistors 375a, ..., 375n is connected to receive a column select signal $y_0$ 380a, ..., $y_n$ 380n, and $y_r$ 380R. The column select signals $y_0$ 380a, ..., $y_n$ 380n, and $y_r$ 380R are generated by decoding the column address portion of an address signal in a column decoder circuit 355. A group of sense amplifiers 385 are connected to all the array of an MRAM device such the sense amplifier 390 is also connected to each of the bit lines 335a, ..., 335n through the gating MOS transistor 375a, ..., 375n for sensing the logic state (low resistance vs high resistance) of each of each of the MTJ devices 306 of the MRAM cell 305 to read data from a selected MRAM cell(s) 305s.

One column of the spin-torque MRAM cell array 300 includes the reference MRAM cells 305R1, 305R2, ..., 305Rm. The reference MRAM cells 305R1, 305R2, ..., 305Rm have one terminal of each MTJ element 306 of each of the reference MRAM cells 305R1, 305R2, ..., 305Rm 305 is connected to a reference bit line 335R. The source of each MOS transistor 307 of each of the reference MRAM cells 305R1, 305R2, ..., 305Rm is connected to a common source line 360. The gate of the select switching MOS transistor 307 of each of the reference MRAM cells 305R1, 305R2, ..., 305Rm on a row of the MRAM cells 305 is connected to a local word line 320a, 320b, ..., 320m to receive a word line select signal from an associated global word line 315a, 315b, ..., 315m to activate the MOS transistor of the reference MRAM cells 305R1, 305R2, ..., 305Rm during writing and reading of a selected MRAM cell 305s. The reference bit line 335R is connected through a reference signal averaging circuit 395 to a reference terminal of the sense amplifier 395 for reading the pre-established program level for each of the reference MRAM cells 305R1, 305R2, ..., 305Rm. The reference read signal 398 is applied to the reference signal averaging circuit 395 to activate the reference signal averaging circuit 395 during a read operation. The reference signal averaging circuit 395 averages the reference signal from the reference MRAM cells 305R1, 305R2, ..., 305Rm and the reference MRAM cells from an adjacent array 301 to create the averages of the two reference cells. The pre-established program level for each of the reference MRAM cells 305R1, 305R2, 305Rm and the reference MRAM cells from an adjacent array 301 are such that one column is of the reference MRAM cells 305R1, 305R2, ..., 305Rm and the reference MRAM cells from an adjacent array 301 are programmed to a maximum resistance ($R_{MAX}$) and the other to a minimum resistance ($R_{MIN}$). These values of resistance provide the necessary reference signal values for the sense amplifier 390.

Each of the global word lines 315a, 315b, ..., 315m is connected to a gate voltage boosting circuit 325a, 325b, ..., 325m. Each of the gate voltage boosting circuits 325a, 325b, ..., 325m have a high voltage pass transistor 326 with a drain connected to the associated global word line 315a, 315b, ..., 315m and a source connected to the associated local word line 320a, 320b, ..., 320m and thus to the gate of the select switching MOS transistor 307 of each of the MRAM cells 305 of the row of the array 300 of MRAM cells 305. The gates of all of the high voltage pass transistors 326 of the gate voltage boosting circuits 325a, 325b, ..., 325m are commonly connected to the row decode circuit 310 to receive the local word line control signal 345 for activating and deactivating the gate voltage boosting circuits 325a, 325b, ..., 325m. An optional clamp diode 328 may be added to each of the gate voltage boosting circuit 325a, 325b, ..., 325m to further prevent an over boost condition, if necessary. The anode of the optional clamp diode 328 is shown connected to the source of the high voltage pass transistor 326 and the cathode connected to the ground reference point. In other embodiments, the cathode of the optional clamp diode 328 is connected to the source of the high voltage pass transistor 326 and the anode connected to an appropriate biasing voltage.

In current semiconductor fabrication processes, the high voltage pass transistor 326 of each of the gate voltage boosting circuits 325a, 325b, . . . , 325m may be a transistor type normally used for Input/Output function of an integrated circuit. The Input/Output type transistors operate at a higher voltage level than that select switching MOS transistor 307 of each of the MRAM cells 305.

Figure 4:
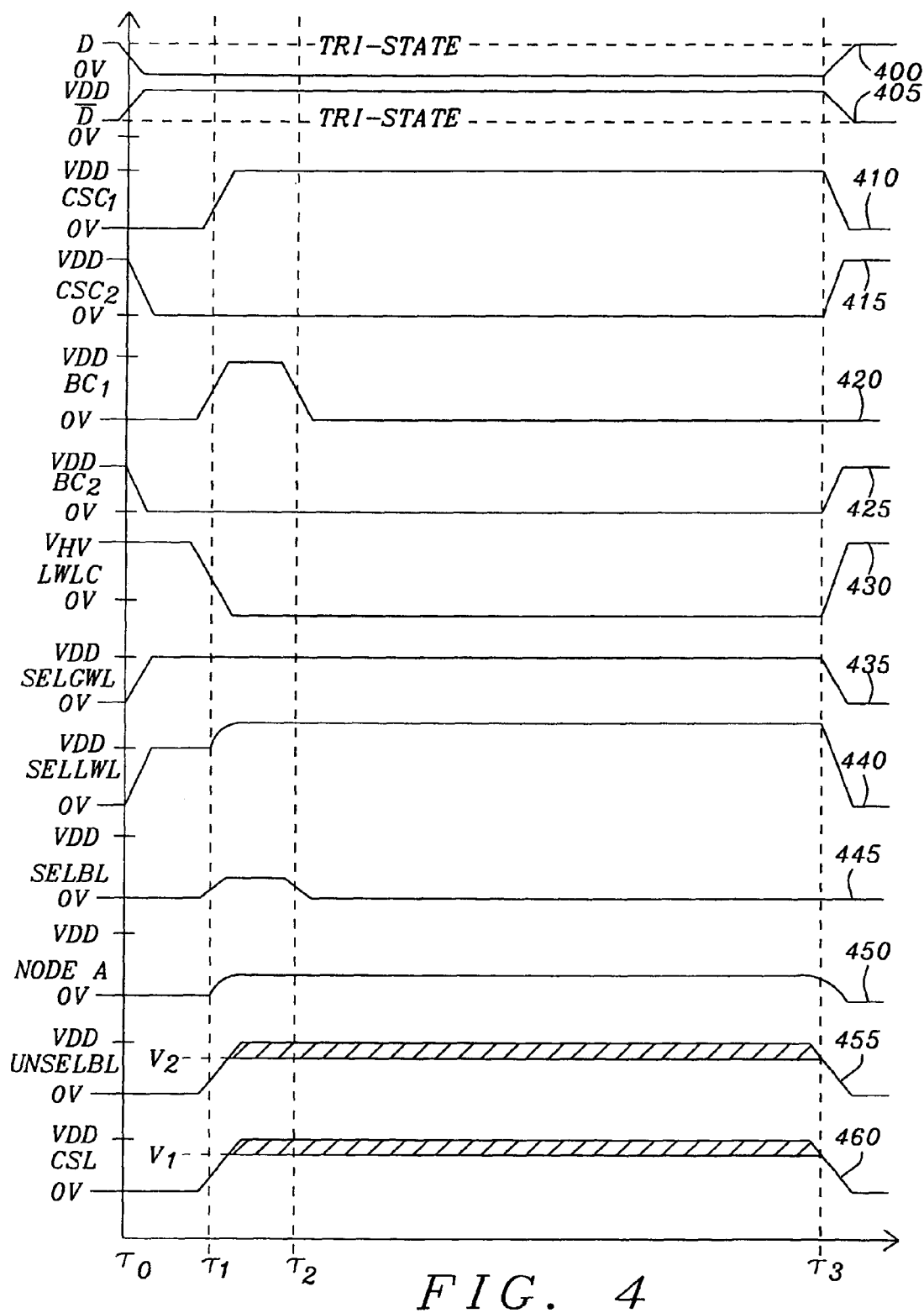
FIG. 4 is a timing diagram for programming a logical "1" to a selected spin-torque MRAM cell in a spin-torque MRAM cell array of this invention.

FIG. 4 is a timing diagram for programming a logical "1" to a selected spin-torque MRAM cell in a spin-torque MRAM cell array of this invention. Refer now to FIG. 4 and FIG. 3 for an explanation for a method of the programming of a logical "1" to a selected MRAM cell 305s. A method for writing a selected spin-torque MRAM cell 305s in an array of spin-torque MRAM cells 300 to a first level (logical "1") begins at time $\tau_0$ by setting the data input signal $D_{0W}$ 314 to a ground reference voltage level (0V) as shown in the plot 400. An inverse data input signal $\overline{D_{0W}}$ (Not shown in FIG. 3) is set at time $\tau_0$ to the voltage level of the power supply voltage source VDD as shown in plot 405. The first common source control signal 370a is set at the ground reference voltage level (0V) prior to the time $\tau_0$ as shown in the plot 410 to keep the MOS transistor 366 turned off. The second common source control signal 370b transits from the voltage level of the power supply voltage source VDD to the at the time $\tau_0$ to the ground reference voltage level (0V), as shown in the plot 415 to turn off the MOS transistor 368. The first bit line control signal 350a is set at the ground reference voltage level (0V) prior to the time $\tau_0$ as shown in the plot 420 to keep the MOS transistor 341 of the bit line precharge circuits 340a, . . . , 340n, and 340R turned off. The second bit line control signal 350b transits from the voltage level of the power supply voltage source VDD to the at the time $\tau_0$ to the ground reference voltage level (0V) to turn off the MOS transistor 342 of the bit line precharge circuits 340a, . . . , 340n, and 340R, as shown in the plot 425. In the plot 430, the local word line control voltage 345 is set to a high voltage level ($V_{HV}$) that is greater than the voltage level of the power supply voltage source VDD at the time $\tau_0$. This voltage level turns on all the high voltage pass transistor 326 of each of the gate voltage boosting circuits 325a, 325b, . . . , 325m to connect the global word lines 315a, 315b, . . . , 315m the local word lines 320a, 320b, . . . , 320m. The selected global word line 315a is activated to transit from the ground reference voltage level (0V) to the voltage level of the power supply voltage source VDD at the time $\tau_0$ as shown in plot 435. With the high voltage pass transistor 326 of the gate voltage boosting circuit 325a turned on, the local word line 320a follows the voltage level of the global word line 315a, as shown in plot 440 at the time $\tau_0$. At the time $\tau_0$, the selected bit line 335n, the unselected bit lines 335a, 335b, . . . the voltage at the junction of the MTJ element 306 and the source of each MOS transistor 307 of each of the MRAM cells 305, and the common source line 360 are set to the ground reference voltage level (0V) as shown respectively in plots 445, 450, 455, and 460.

At the time $\tau_1$, the first common source control signal 370a transits from the ground reference voltage level (0V), as shown in the plot 410 to the voltage level of the power supply voltage source VDD to turn on the MOS transistor 366. The second common source control signal 370b remains, at the time $\tau_1$, to the ground reference voltage level (0V), as shown in the plot 415 to keep the MOS transistor 368 turned off. This begins the transition of the common source line select circuit 365 from the ground reference voltage level (0V) to the voltage level $V_1$, as shown in plot 460. The voltage level $V_1$ is equal to or less than the voltage level of the power supply voltage source VDD. Also, at the time $\tau_1$, the bit line control signal 350a transits from the ground reference voltage level (0V) to the voltage level of the power supply voltage source VDD to turn on the MOS transistor 341 to connect the selected bit line 335n to the voltage source $V_2$ as shown in plot 420. The voltage level $V_2$ is equal to or less than the voltage level of the power supply voltage source VDD. The second bit line control signal 350b remains at the ground reference voltage level (0V) to keep the MOS transistors 342 of the bit line precharge circuits 340a, . . . , 340n, and 340R turned off, as shown in the plot 425. All the unselected bit lines 335a, 335b, . . . and the one selected bit line 335n are being charged up towards voltage level $V_2$. Since the selected bit line 335n also has the column select transistor yn 375n turned on, it only reaches a transient intermediate level as shown in plot 445. The unselected bit lines 335a, . . . and the common source line 460 voltage levels rise towards voltage level $V_2$, as shown in plots 455 and 460. As the voltage levels rise, the gates of MOS transistor 307 of each of the MRAM cells 305 of the unselected MRAM cells 305 on the selected local word line 320a serve as boost capacitors for the local word line 320a, so the local word line 320a voltage rises.

At a time just prior to the time $\tau_1$, the local word line control voltage 345 transits from the high voltage level ($V_{HV}$) to the ground reference voltage level (0V) to turn off the high voltage pass transistor 326 of each of the gate voltage boosting circuits 325a, 325b, . . . , 325m, as shown in plot 430. The voltage level of the selected local word line 320a is boosted, as shown in plot 440, and thus the gate drive of each MOS transistor 307 of each of the MRAM cells 305 to compensate the rise of source voltage to ensure that the program current through the MTJ element 306 of the selected MRAM cell 305s.

At the time $\tau_2$, the first bit line control signal 350a is set at the ground reference voltage level (0V) as shown in the plot 420 to turn off the MOS transistor 341 of the circuits 340a, . . . , 340n, and 340R. The selected bit line 335n returns to ground reference voltage level (0V) as shown in the plot 445. Since the unselected bit lines 335a, 335b, . . . are essentially floating and their capacitances are charged to the voltage level $V_1$, the unselected bit lines 335a, 335b, . . . remain at the voltage level $V_1$.

At the time $\tau_3$, the data input signal $D_{0W}$ 314 is set to a tri-state high impedance as shown in the plot 400. The inverse data input signal $\overline{D_{0W}}$ (Not shown in FIG. 3) is set at time $\tau_3$ to a tri-state high impedance as shown in plot 405. The first common source control signal 370a is set at the ground reference voltage level (0V) prior to the time $\tau_3$ as shown in the plot 410 to turn off the MOS transistor 366. The second common source control signal 370b transits to the voltage level of the power supply voltage source VDD at the time $\tau_3$ to the ground reference voltage level (0V), as shown in the plot 415 to turn on the MOS transistor 368. The first bit line control signal 350a remains at the ground reference voltage level (0V) as shown in the plot 420 to keep the MOS transistor 341 of the bit line precharge circuits 340a, . . . , 340n, and 340R turned off. The second bit line control signal 350b transits from the voltage level of the ground reference voltage level (0V) at the time $\tau_3$ to the power supply voltage source VDD to turn on the MOS transistor 342 of the bit line precharge circuits 340a, . . . , 340n, and 340R as shown in the plot 425. In the plot 430, the local word line control voltage 345 is set to a high voltage level ($V_{HV}$) that is greater than the voltage level of the power supply voltage source VDD at the time $\tau_3$. This voltage level turns on all the high voltage pass transistor 326 of each of the gate voltage boosting circuits 325a, 325b, ..., 325m to connect the global word lines 315a, 315b, ..., 315m the local word lines 320a, 320b, ..., 320m. The selected global word line 315a is deactivated to transit from the voltage level of the power supply voltage source VDD to the ground reference voltage level (0V) at the time $\tau_3$ as shown in plot 435. With the high voltage pass transistor 326 of the gate voltage boosting circuit 325a turned on, the local word line 320a follows the voltage level of the global word line 315a, as shown in plot 440 at the time $\tau_3$ and is essentially at the ground reference voltage level (0V). The selected bit line 335n, the unselected bit lines 335a, 335b, ... the voltage at the junction of the MTJ element 306 and the source of each MOS transistor 307 of each of the MRAM cells 305, and the common source line 360 are set or transit to the ground reference voltage level (0V) as shown respectively in plots 445, 450, 455, and 460

Figure 5:
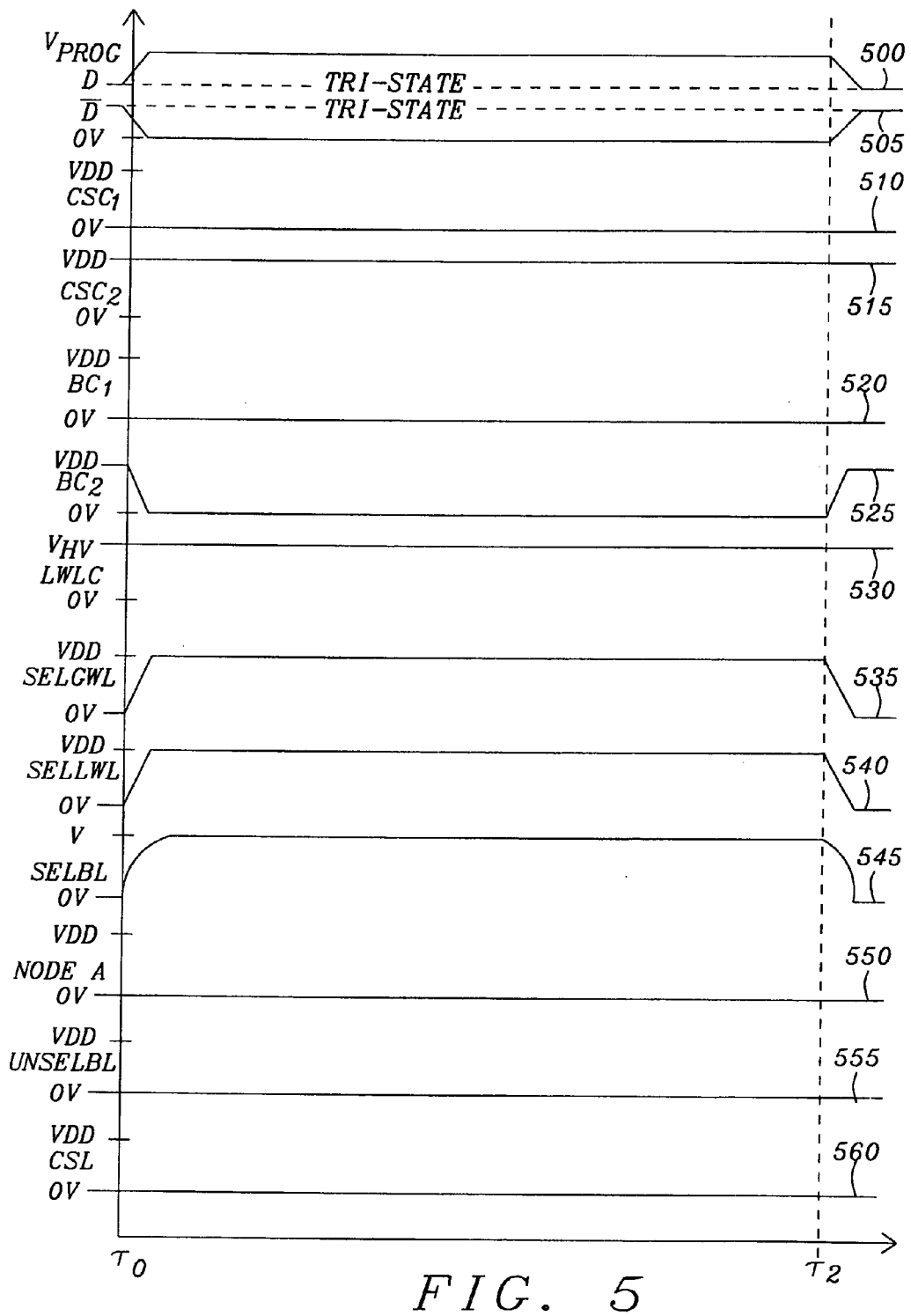
FIG. 5 is a timing diagram for programming a logical "0" to a selected spin-torque MRAM cell in a spin-torque MRAM cell array of this invention.

The programming of the logical "0" is similar to the programming for a selected spin-torque MRAM cell of the prior art. FIG. 5 is a timing diagram for programming a logical "0" to a selected spin-torque MRAM cell in a spin-torque MRAM cell array of this invention. Refer now to FIG. 5 and FIG. 3 for an explanation for a method of the programming of a logical "0" to a selected MRAM cell 305s. A method for writing a selected spin-torque MRAM cell 305s in an array of spin-torque MRAM cells 300 to a second level (logical "0") begins at time $\tau_0$ by setting the data input signal $D_{ow}$ 314 from a tri-state intermediate level to a desired logical "0" program voltage level as shown in the plot 500. An inverse data input signal $\overline{D_{ow}}$ (Not shown in FIG. 3) is set at time $\tau_0$ to the voltage level of the ground reference voltage level (0V) as shown in plot 505. The first common source control signal 370a is set at the ground reference voltage level (0V) prior to the time $\tau_0$ as shown in the plot 510 to keep the MOS transistor 366 turned off. The second common source control signal 370b is set at the voltage level of the power supply voltage source VDD, as shown in the plot 515 to keep the MOS transistor 368 turned on. The first bit line control signal 350a is set at the ground reference voltage level (0V) prior to the time $\tau_0$ as shown in the plot 520 to keep the MOS transistor 341 of the bit line precharge circuits 340a, ..., 340n, and 340R turned off. The second bit line control signal 350b transits from the voltage level of the power supply voltage source VDD to the at the time $\tau_0$ to the ground reference voltage level (0V) to keep the MOS transistor 342 of the bit line precharge circuits 340a, ..., 340n, and 340R turned off, as shown in the plot 525. In the plot 530, the local word line control voltage 345 is set to a high voltage level ($V_{HV}$) that is greater than the voltage level of the power supply voltage source VDD at the time $\tau_0$. This voltage level turns on all the high voltage pass transistor 326 of each of the gate voltage boosting circuits 325a, 325b, ..., 325m to connect the global word lines 315a, 315b, ..., 315m the local word lines 320a, 320b, ..., 320m. The selected global word line 315a is activated to transit from the ground reference voltage level (0V) to the voltage level of the power supply voltage source VDD at the time $\tau_0$ as shown in plot 535. With the high voltage pass transistor 326 of the gate voltage boosting circuit 325a turned on, the local word line 320a follows the voltage level of the global word line 315a, as shown in plot 540 at the time $\tau_0$. Since the selected bit line 335n also has the column select transistor yn 375n turned on, the read/write row decoder drivers 312 drives the selected bit line 335n to transit at the time $\tau_0$, from the ground reference voltage level (0V) to approach the voltage level of the desired logical "0" program voltage level as shown in plot 545. Also at the time $\tau_0$, the unselected bit lines 335a, 335b, ..., the voltage at the junction of the MTJ element 306 and the source of each MOS transistor 307 of each of the MRAM cells 305, and the common source line 360 are set to the ground reference voltage level (0V) as shown respectively in plots 550, 555, and 560.

At completion of the writing of the logical "0" to the selected MRAM cell 305s at the time $\tau_2$, the data input signal $D_{ow}$ 314 and inverse data input signal $\overline{D_{ow}}$ (Not shown in FIG. 3) are set to a tri-state high impedance as shown in the plot 500 and plot 505. The first common source control signal 370a remains set at the ground reference voltage level (0V) prior to the time $\tau_2$ as shown in the plot 510 to turn off the MOS transistor 366. The second common source control signal 370b remains set to the voltage level of the power supply voltage source VDD, as shown in the plot 515 to keep the MOS transistor 368 turned on. The first bit line control signal 350a remains at the ground reference voltage level (0V) as shown in the plot 520 to keep the MOS transistor 341 of the bit line precharge circuits 340a, ..., 340n, and 340R turned off. The second bit line control signal 350b transits from the voltage level of the power supply voltage source VDD to the ground reference voltage level (0V) at the time $\tau_2$ to turn off the MOS transistor 342 of the bit line precharge circuits 340a, ..., 340n, and 340R as shown in the plot 525. In the plot 530, the local word line control voltage 345 remains set to a high voltage level ($V_{HV}$) that is greater than the voltage level of the power supply voltage source VDD at the time $\tau_2$. This voltage level keeps all the high voltage pass transistors 326 of each of the gate voltage boosting circuits 325a, 325b, ..., 325m turned on to connect the global word lines 315a, 315b, ..., 315m the local word lines 320a, 320b, ..., 320m. The selected global word line 315a is deactivated to transit from the voltage level of the power supply voltage source VDD to the ground reference voltage level (0V) at the time $\tau_2$ as shown in plot 535. With the high voltage pass transistor 326 of the gate voltage boosting circuit 325a turned on, the local word line 320a follows the voltage level of the global word line 315a, as shown in plot 540 at the time $\tau_2$ and is essentially at the ground reference voltage level (0V). Since the selected bit line 335n has the column select transistor yn 375n turned off and the second bit line control signal 350b has turned on the MOS transistor 342 of the bit line precharge circuits 340a, ..., 340n, and 320R to cause the selected bit line 335n to transit to the ground reference voltage level (0V), as shown in the plot 545. The unselected bit lines 335a, 335b, ..., the voltage at the junction of the MTJ element 306, and the source of each MOS transistor 307 of each of the MRAM cells 305, and the common source line 360 are set or transit to the ground reference voltage level (0V) as shown respectively in plots 550, 555, and 560

Figure 6:
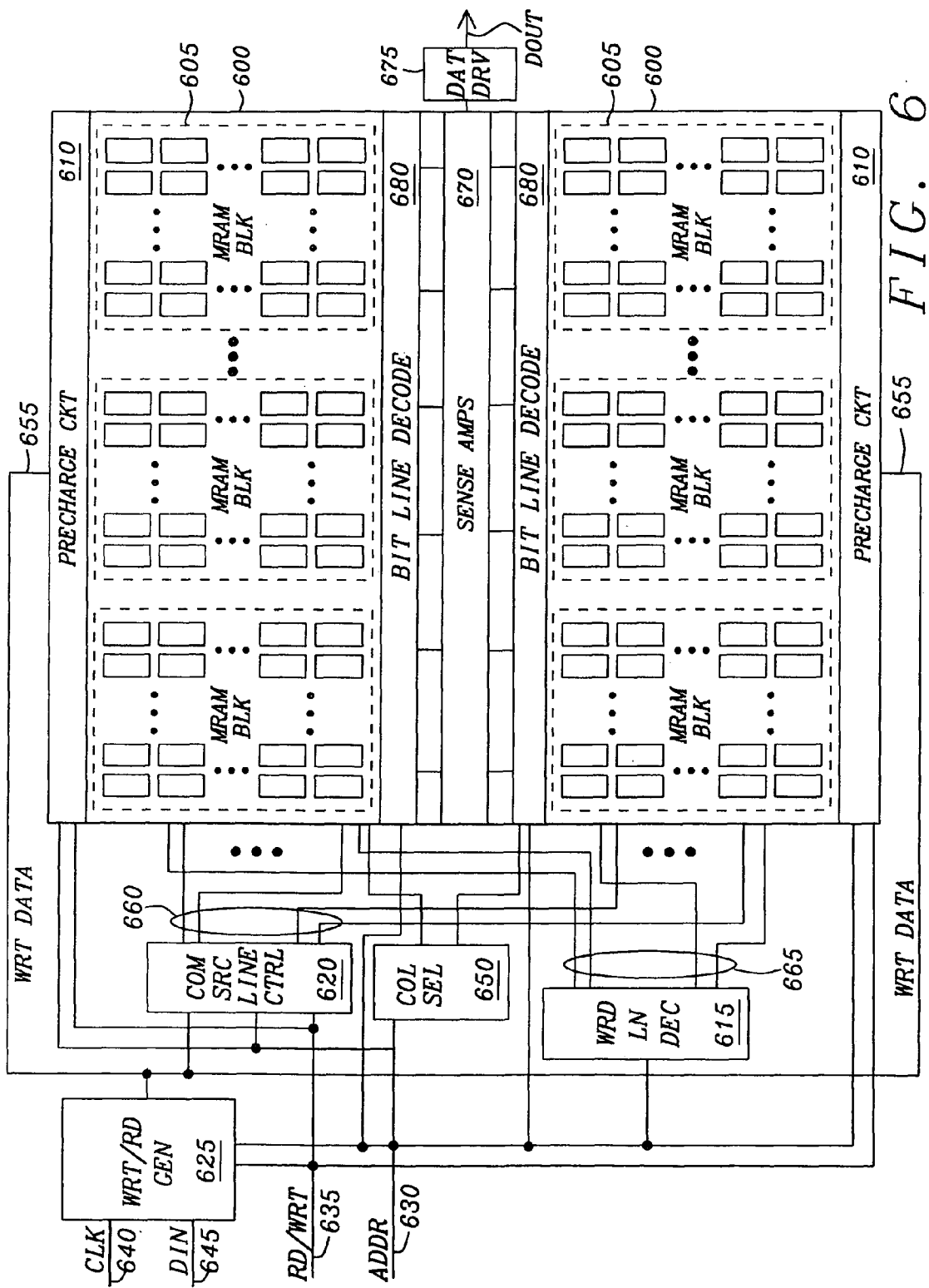
FIG. 6 is block diagram of a spin-torque magnetic random access memory device of this invention.

Refer now to FIG. 6 for a discussion of an embodiment of a spin-torque magnetic random access memory device. Each array of MRAM cells as described in FIG. 1 are formed into groups of arrays (FIG. 3 illustrating a single group) to construct a spin-torque MRAM device. Groups of the MRAM cell arrays 605 are organized into groups of arrays 600. The precharge circuit 610 is connected to each of the MRAM cell arrays 605 to precharge the appropriate bit lines of the MRAM cell arrays 605 dependent upon the state of the data signal 655 being written to the MRAM cell arrays 605. The column select circuit 650 provides the column select signal $y_1$ 652a and $y_2$ 652b to activate the gating MOS transistors 375a, ..., 375n, and 375R of FIG. 3 for a selected column of the MRAM cell arrays 605. The bit line decode circuit 680 is connected to each of the groups of arrays 600 to for selecting the columns of the MRAM cell arrays 605 based on decoding the address 630.

A word line decode circuit 615 is connected to each of the global word lines 665 of each of the MRAM cell arrays 605. The global word lines 665 are each connected to associated the local word lines 320a, 320b, . . . , 320m of FIG. 3 as described above to receive a word line select signal through the gate voltage boosting circuit 325a, 325b, . . . , 325m from associated global word line 665. The word line decode circuit 615 receives the address signal 630 defining which row of which of the MRAM cell arrays 605 is to written to or read from. The common source select line decode circuit 620 is connected to source select lines 660 of all of the MRAM cell arrays 605 to provide the source select signal for writing and reading the selected MRAM cells of the MRAM cell arrays 605. The common source select line decode circuit 620 receives the address signal 630 and the read/write signal 635 and determines which of the MRAM cells is to be read or written.

The bipolar write/read generator 625 receive the data input signal 645 and a clock timing signal 640. With the read/write signal 635 and the address signal 630 provides the necessary biasing and control signals to the precharge circuit 610, the column select circuit 650, the bit line decode circuit 680, and the common source select line decode circuit 620 for reading data from and writing data to the MRAM cells of the MRAM cell arrays 605. During a read operation, the sense amplifier 670 receives the data sense signals from the selected MRAM cells, amplifies, and conditions the data sense signals to generate the output data signals 675 for transfer external circuitry.

While this invention has been particularly shown and described with reference to the preferred embodiments thereof, it will be understood by those skilled in the art that various changes in form and details may be made without departing from the spirit and scope of the invention.

The invention claimed is:

1. A spin-torque MRAM cell array comprising:
    a plurality of spin-torque MRAM cells arranged in rows and columns, each spin-torque MRAM cell comprising:
        a magnetic tunnel junction element, and
        a select switching device having a drain terminal connected to a first terminal of the magnetic tunnel junction element;
    a plurality of local word lines, each local word line associated with one row of the plurality of spin-torque MRAM cells and connected to a gate terminal of the select switching device of each spin-torque MRAM cell on the one row to control activation and deactivation of the select switching device; and
    a plurality, of gate voltage boosting circuits, each gate voltage boosting circuit placed between an associated global word line of a plurality of global word lines and an associated local word line of the plurality of local word lines to boost a local word line voltage applied to a gate of the select switching device of the selected spin-torque MRAM cell during writing the magnetic tunnel junction element of a selected spin-torque MRAM cell as a first level with a program current flowing from the switching transistor to the magnetic tunnel junction element when a local word line control signal is deactivated at a first time and a bit line associated with the selected spin-torque MRAM cell is precharged between the first time and a second time to generate a boost voltage from the gate boosting circuit to the gate of the select switching transistor of the selected spin-torque MRAM cell for compensating for a rise of a voltage at a source of select switching device of the selected spin-torque MRAM cell.

2. The spin-torque MRAM cell array of claim 1 wherein a gate capacitance of the select switching devices of unselected spin-torque MRAM cells sharing a local word line function as boost capacitors that generate the boost voltage for the gate boosting circuit.

3. The spin-torque MRAM cell array of claim 1 wherein each of the plurality of gate voltage boosting circuits comprises:
    a high voltage switching transistor having a drain terminal connected to the global word line associated with the gate voltage boosting circuit, a source connected to the gate of the gate of the select switching device and a gate connected to receive the local word line control signal to activate and deactivate the high voltage switch transistor for boosting the local word line voltage.

4. The spin-torque MRAM cell array of claim 3 wherein each of the plurality of gate voltage boosting circuits further comprises a clamping device to prevent an over boost condition.

5. The spin-torque MRAM cell array of claim 1 further comprising a plurality of bit lines, each bit line associated with one column of the columns of the plurality of spin-torque MRAM cells and connected to a second terminal of the magnetic tunnel junction element.

6. The spin-torque MRAM cell array of claim 1 further comprising a common source line connected to a source of each of the select switching devices of the plurality of spin-torque MRAM cells provide a source or sink for a write current for programming the spin-torque MRAM cell.

7. The spin-torque MRAM cell array of claim 6 further comprising a common source select circuit connected to the common source line for selecting the source or sink for the write current and for precharging the gate capacitance of the select switching devices of the unselected spin-torque MRAM cell.

8. The spin-torque MRAM cell array of claim 7 wherein the common source line select circuit comprises;
    a first transistor having a drain terminal connected to a first voltage source and a source terminal connected to the common source line; and
    a second transistor having a drain terminal connected to the common source line and a source terminal connected to a ground reference point;
    wherein common source line control signals are connected to gates of the first and second transistors to turn on and turn off the first and second transistors to provide a source or sink for the write current through the selected spin-torque MRAM cell during a program operation.

9. The spin-torque MRAM cell array of claim 1 further comprising a plurality of bit line precharge circuits, each bit line precharge circuit associated with one column of the plurality of spin-torque MRAM cells for precharging the associated bit line dependent upon a datum to be written and for precharging the bit lines of the unselected spin-torque MRAM cells and thus the gate capacitances of the unselected spin-torque MRAM cells.

10. The spin-torque MRAM cell array of claim 9 wherein each of the plurality of bit line precharge circuits comprises:
    a third transistor having a drain terminal connected to a first voltage source and a source terminal connected to the associated bit line; and
    a fourth transistor having a drain terminal connected to the associated bit line and a source terminal connected to a ground reference point;
    wherein bit line control signals are connected to gates of the third and fourth transistors to turn on and turn off the third and fourth transistors to control directionality of the write current flow through a selected spin-torque MRAM cell during a program operation.

11. The spin-torque MRAM cell array of claim 1 wherein a selected spin-torque MRAM cell is written to the first level during a first writing step by:
- activating the global word line associated with the selected spin-torque MRAM cell at a first time;
- activating the local word line control signal to effectively connect the global word line associated with the selected spin-torque MRAM cell and the local word line associated with the selected spin-torque MRAM cell at the first time;
- applying a data input signal prior to the first time to a bit line associated with the selected spin-torque MRAM cell to generate a current to program the magnetic tunnel junction element of the selected spin-torque MRAM cell to the first level at the first time;
- deactivating the local word line control signal to effectively disconnect the global word line associated with the selected spin-torque MRAM cell and the local word line associated with the selected spin-torque MRAM cell at a second time to float the local word line associated with the selected spin-torque MRAM cell;
- precharging the bit line between the first time and the second time for boosting the associated local word line to a higher voltage level to compensate for the rise of the voltage at the source of the select switching device of the selected spin-torque MRAM cell.

12. A spin-torque magnetic random access memory device comprising
- a plurality of spin-torque MRAM cell arrays arranged in a plurality of groups, each spin-torque MRAM array comprising:
  - a plurality of spin-torque MRAM cells arranged in rows and columns, each spin-torque MRAM cell comprising:
    - a magnetic tunnel junction element, and
    - a select switching device having a drain terminal connected to a first terminal of the magnetic tunnel junction element;
  - a plurality of local word lines, each local word line associated with one row of the plurality of spin-torque MRAM cells and connected to a gate terminal of the select switching device of each spin-torque MRAM cell on the one row to control activation and deactivation of the select switching device; and
  - a plurality of gate voltage boosting circuits, each gate voltage boosting circuit placed between an associated global word line of a plurality of global word lines and an associated local word line of the plurality of local word lines to boost a local word line voltage applied to a gate of the select switching device of the selected spin-torque MRAM cell during writing the magnetic tunnel junction element of a selected spin-torque MRAM cell as a first level with a program current flowing from the switching transistor to the magnetic tunnel junction element when a local word line control signal is deactivated at a first time and a bit line associated with the selected spin-torque MRAM cell is precharged between the first time and a second time to generate a boost voltage from the gate boosting circuit to the gate of the select switching transistor of the selected spin-torque MRAM cell for compensating for a rise of a voltage at a source of the select switching device of the selected spin-torque MRAM cell.

13. The spin-torque magnetic random access memory device of claim 12 wherein a gate capacitance of the select switching devices of unselected spin-torque MRAM cells sharing a local word line function as boost capacitors that generate the boost voltage for the gate boosting circuit.

14. The spin-torque magnetic random access memory device of claim 12 wherein each of the plurality of gate voltage boosting circuits comprises:
- a high voltage switching transistor having a drain terminal connected to the global word line associated with the gate voltage boosting circuit, a source connected to the gate of the gate of the select switching device and a gate connected to receive the local word line control signal to activate and deactivate the high voltage switch transistor for boosting the local word line voltage.

15. The spin-torque magnetic random access memory device of claim 14 wherein each of the plurality of gate voltage boosting circuits further comprises a clamping device to prevent an over boost condition.

16. The spin-torque magnetic random access memory device of claim 12 wherein the spin-torque MRAM cell array further comprises a plurality of bit lines, each bit line associated with one column of the columns of the plurality of spin-torque MRAM cells and connected to a second terminal of the magnetic tunnel junction element.

17. The spin-torque magnetic random access memory device of claim 12 further comprising a common source line connected to a source of each of the select switching devices of the plurality of spin-torque MRAM cells provide a source or sink for a write current for programming the spin-torque MRAM cell and for precharging the gate capacitance of the select switching devices of the unselected spin-torque MRAM cell.

18. The spin-torque magnetic random access memory device of claim 17 wherein the spin-torque MRAM cell array further comprises a common source select circuit connected to the common source line for selecting the source or sink for the write current.

19. The spin-torque magnetic random access memory device of claim 18 wherein the common source line select circuit comprises;
- a first transistor having a drain terminal connected to a first voltage source and a source terminal connected to the common source line; and
- a second transistor having a drain terminal connected to the common source line and a source terminal connected to a ground reference point;
- wherein common source line control signals are connected to gates of the first and second transistors to turn on and turn off the first and second transistors to provide a source or sink for the write current through the selected spin-torque MRAM cell during a program operation.

20. The spin-torque magnetic random access memory device of claim 12 wherein the spin-torque MRAM cell array further comprises a plurality of bit line precharge circuits, each bit line precharge circuit associated with one column of the plurality of spin-torque MRAM cells and for precharging the bit lines of the unselected spin-torque MRAM cells and thus the gate capacitances of the unselected spin-torque MRAM cells.

21. The spin-torque magnetic random access memory device of claim 20 wherein each of the plurality of bit line precharge circuits comprises:
- a third transistor having a drain terminal connected to a first voltage source and a source terminal connected to the associated bit line; and a fourth transistor having a drain terminal connected to the associated bit line and a source terminal connected to a ground reference point;

wherein bit line control signals are connected to gates of the third and fourth transistors to turn on and turn off the third and fourth transistors to control directionality of the write current flow through a selected spin-torque MRAM cell during a program operation.

22. The spin-torque magnetic random access memory device of claim 12 wherein a selected spin-torque MRAM cell is written to the first level during a first writing step by:

activating the global word line associated with the selected spin-torque MRAM cell at a first time;

activating the local word line control signal to effectively connect the global word line associated with the selected spin-torque MRAM cell and the local word line associated with the selected spin-torque MRAM cell at the first time;

applying a data input signal prior to the first time to a bit line associated with the selected spin-torque MRAM cell to generate a current to program the magnetic tunnel junction element of the selected spin-torque MRAM cell to the first level at the first time;

deactivating the local word line control signal to effectively disconnect the global word line associated with the selected spin-torque MRAM cell and the local word line associated with the selected spin-torque MRAM cell at a second time to float the local word line associated with the selected spin-torque MRAM cell;

precharging the bit line between the first time and the second time for boosting the associated local word line to a higher voltage level to compensate the rise of the voltage at the source of the select switching device of the selected spin-torque MRAM cell.

23. A method for writing a selected spin-torque MRAM cell in an array of spin-torque MRAM cells to a first level with a program current from the switching transistor to the magnetic tunnel junction element comprising the steps of:

providing a plurality of spin-torque MRAM cells arranged in rows and columns, each spin-torque MRAM cell comprising:
 a magnetic tunnel junction element, and
 a select switching device having a drain terminal connected to a first terminal of the magnetic tunnel junction element;

providing a plurality of local word lines, each local word line associated with one row of the plurality of spin-torque MRAM cells and connected to a gate terminal of the select switching device of each spin-torque MRAM cell on the one row to control activation and deactivation of the select switching device; and providing a plurality of gate voltage boosting circuits, each gate voltage boosting circuit placed between an associated global word line of a plurality of global word lines and an associated local word line of the plurality of local word lines to boost a local word line voltage applied to a gate of the select switching device of the selected spin-torque MRAM cell during writing of the first level to the magnetic tunnel junction element of a selected spin-torque MRAM cell when activated by a local word line control signal;

activating the global word line associated with the selected spin-torque MRAM cell;

activating the local word line control signal to effectively connect the global word line associated with the selected spin-torque MRAM cell and the local word line associated with the selected spin-torque MRAM cell;

applying a data input signal to a bit line associated with the selected spin-torque MRAM cell to generate a current to program the magnetic tunnel junction element of the selected spin-torque MRAM cell to the first level at the first time;

precharging a gate capacitance of the select switching devices of the unselected spin-torque MRAM cells; and deactivating the local word line control signal at a first time to effectively disconnect the global word line associated with the selected spin-torque MRAM cell and the local word line associated with the selected spin-torque MRAM cell to float the local word line associated with the selected spin-torque MRAM cell;

precharging the bit line between the first time and a second time for boosting the associated local word line to a higher voltage level to boost the associated local word line and thus the gate of the select switching transistor of the selected spin-torque MRAM cell to the higher voltage level for compensating for a rise of a voltage at a source of the select switching device of the selected spin-torque MRAM cell.

24. The method for writing a selected spin-torque MRAM cell in an array of spin-torque MRAM cells to a first level of claim 23 wherein a gate capacitance of the select switching devices of unselected spin-torque MRAM cells sharing a local word line boost the associated local word line to the higher voltage level.

25. A method for forming a spin-torque MRAM cell array comprising the steps of:

forming a plurality of spin-torque MRAM cells arranged in rows and columns, wherein forming each spin-torque MRAM cell comprises the steps of:
 forming a magnetic tunnel junction element, and
 forming a select switching device having a drain terminal connected to a first terminal of the magnetic tunnel junction element;

forming a plurality of local word lines, wherein forming each local word line comprises the steps of
 associating each local word line with one row of the plurality of spin-torque MRAM cells, and
 connecting each word line to a gate terminal of the select switching device of each spin-torque MRAM cell on its associated row to control activation and deactivation of the select switching device; and forming a plurality of gate voltage boosting circuits, wherein forming each gate voltage boosting circuit comprises the steps of:
 placing each gate voltage boosting circuit between an associated global word line of a plurality of global word lines and an associated local word line of the plurality of local word lines to boost a local word line voltage applied to a gate of the selected switching device during writing the magnetic tunnel junction element of a selected spin-torque MRAM cell as a first level during a first writing step with a program current flowing from the switching transistor to the magnetic tunnel junction element when a local word line control signal is deactivated at a first time and a bit line associated with the selected spin-torque MRAM cell is precharged between the first time and a second time to generate a boost voltage for the gate boosting circuit to the gate of the select switching transistor of the selected spin-torque MRAM cell for compensating for a rise of a voltage at a source of the select switching device of the selected spin-torque MRAM cell.

26. The method for forming a spin-torque MRAM cell array of claim 25 wherein a gate capacitance of the select switching devices of unselected spin-torque MRAM cells sharing a local word line function as boost capacitors that generate the boost voltage for the gate boosting circuit.

27. The method for forming a spin-torque MRAM cell array of claim 25 wherein forming each of the plurality of gate voltage boosting circuits comprises the steps of:
   forming a high voltage switching transistor;
   connecting a drain terminal of the high voltage switching transistor to the global word line associated with the gate voltage boosting circuit;
   connecting a source terminal of the high voltage switching transistor to the gate of the select switching device; and
   connecting a gate of the high voltage switching transistor to receive the local word line control signal to activate and deactivate the high voltage switch transistor for boosting the local word line voltage.

28. The method for forming a spin-torque MRAM cell array of claim 27 wherein forming each of the plurality of gate voltage boosting circuits further comprises the steps of:
   forming a clamping device to prevent an over boost condition;
   connecting a first terminal of the clamping device to the source of the high voltage switching transistor and the associated word line; and
   connecting a second terminal of the clamping device to the ground reference point.

29. The method for forming a spin-torque MRAM cell array of claim 25 further comprising the step of forming a plurality of bit lines, wherein forming each bit line comprises the steps of:
   associating each bit line with one column of the columns of the plurality of spin-torque MRAM cells; and
   connecting each bit line to a second terminal of the magnetic tunnel junction element.

30. The method for forming a spin-torque MRAM cell array of claim 25 further comprising the steps of:
   forming a common source line; and
   connecting the common source line to a source of each of the select switching devices of the plurality of spin-torque MRAM cells to provide a source or sink for a write current for programming the spin-torque MRAM cell.

31. The method for forming a spin-torque MRAM cell array of claim 30 further comprising the steps of
   forming a common source select circuit; and
   connecting the common source select circuit to the common source line for selecting the source or sink for the write current and for precharging the gate capacitance of the select switching devices of the unselected spin-torque MRAM cell.

32. The method for forming a spin-torque MRAM cell array of claim 31 wherein forming the common source line select circuit comprises steps of:
   forming a first transistor having a drain terminal connected to a first voltage source and a source terminal connected to the common source line;
   forming a second transistor having a drain terminal connected to the common source line and a source terminal connected to a ground reference point; and
   connecting common source line control signals to gates of the first and second transistors to turn on and turn off the first and second transistors to provide a source or sink for the write current through the selected spin-torque MRAM cell during a program operation.

33. The method for forming a spin-torque MRAM cell array of claim 25 further comprising the steps of:
   forming a plurality of bit line precharge circuits; and
   connecting each bit line precharge circuit with one column of the plurality of spin-torque MRAM cells and for precharging the bit lines of the unselected spin-torque MRAM cells and thus the gate capacitances of the unselected spin-torque MRAM cells.

34. The method for forming a spin-torque MRAM cell array of claim 33 wherein forming each of the plurality of bit line precharge circuits comprises the steps of:
   forming a third transistor having a drain terminal connected to a first voltage source and a source terminal connected to an associated bit line;
   forming a fourth transistor having a drain terminal connected to the associated bit line and a source terminal connected to a ground reference point; and
   connecting the bit line control signals to gates of the third and fourth transistors to turn on and turn off the third and fourth transistors to control directionality of the write current flow through a selected spin-torque MRAM cell during a program operation.

* * * * *